(12) United States Patent
Wieser et al.

(10) Patent No.: US 12,126,252 B2
(45) Date of Patent: Oct. 22, 2024

(54) DETERMINATION OF FILTER PARAMETERS IN AN INVERTER

(71) Applicant: Fronius International GmbH, Pettenbach (AT)

(72) Inventors: Stefan Wieser, Wels-Thalheim (AT); Michael Rothböck, Wels-Thalheim (AT); Roland Pieler, Wels-Thalheim (AT); Harald Kreuzer, Wels-Thalheim (AT)

(73) Assignee: Fronius International GmbH, Pettenbach (AT)

( * ) Notice: Subject to any disclaimer, the term of this patent is extended or adjusted under 35 U.S.C. 154(b) by 199 days.

(21) Appl. No.: 17/798,456

(22) PCT Filed: Feb. 12, 2021

(86) PCT No.: PCT/EP2021/053437
§ 371 (c)(1),
(2) Date: Aug. 9, 2022

(87) PCT Pub. No.: WO2021/160791
PCT Pub. Date: Aug. 19, 2021

(65) Prior Publication Data
US 2023/0116269 A1    Apr. 13, 2023

(30) Foreign Application Priority Data
Feb. 13, 2020    (EP) .................................... 20157072

(51) Int. Cl.
*H02M 1/12*    (2006.01)
*G01R 27/26*    (2006.01)
(Continued)

(52) U.S. Cl.
CPC ........ *H02M 1/126* (2013.01); *G01R 27/2605* (2013.01); *G01R 31/64* (2020.01); *H03H 7/0115* (2013.01)

(58) Field of Classification Search
CPC ............ G01R 27/2605; G01R 31/2837; G01R 31/42; G01R 31/64; H02M 1/126;
(Continued)

(56) References Cited

U.S. PATENT DOCUMENTS

| | | | |
|---|---|---|---|
| 10,148,225 B2 | 12/2018 | Unru et al. | |
| 11,474,164 B2 * | 10/2022 | Benesch | ................ H02H 9/005 |

(Continued)

FOREIGN PATENT DOCUMENTS

| | | |
|---|---|---|
| EP | 3 069 158 | 7/2017 |
| EP | 3 232 217 | 10/2017 |

(Continued)

OTHER PUBLICATIONS

Int'l Search Report (Form PCT/ISA/210) conducted in Int'l Appln. No. PCT/EP2021/053437 (May 11, 2021).

(Continued)

*Primary Examiner* — Jared Fureman
*Assistant Examiner* — Nicolas Bellido
(74) *Attorney, Agent, or Firm* — GREENBLUM & BERNSTEIN, P.L.C.

(57) ABSTRACT

A switching arrangement of an inverter with a filter circuit and a grid relay. For the filter circuit use is made of an equivalent circuit consisting of effective filter inductance, from filter inductance and topology of the filter circuit and effective filter capacitance, from the filter capacitance and topology of the filter circuit. The effective filter inductance and the effective filter capacitance are system parameters. To determine system parameters, a voltage pulse is applied between a first conductor output and a second conductor (Continued)

output when the grid relay is open; the first conductor output and the second conductor output are connected via the switching arrangement to form a closed oscillating circuit a current value of the effective filter inductance and the effective filter capacitance is determined from a current curve and/or voltage curve in the resonant circuit as system parameters for controlling the switching arrangement.

10 Claims, 7 Drawing Sheets

(51) Int. Cl.
*G01R 31/64* (2020.01)
*H03H 7/01* (2006.01)

(58) Field of Classification Search
CPC ...... H02M 1/32; H02M 7/537; H03H 7/0115; Y02B 70/10
See application file for complete search history.

(56) References Cited

U.S. PATENT DOCUMENTS

| 11,742,745 | B2* | 8/2023 | Pieler | H02M 1/126 |
| | | | | 363/40 |
| 2016/0254783 | A1 | 9/2016 | Unru et al. | |
| 2021/0270913 | A1 | 9/2021 | Benesch et al. | |
| 2023/0051498 | A1* | 2/2023 | Pieler | G01R 27/2611 |

FOREIGN PATENT DOCUMENTS

| EP | 3588723 A1 * | 1/2020 | ......... G01R 27/2605 |
| WO | 2015/071378 | 5/2015 | |

OTHER PUBLICATIONS

Int'l Written Opinion (Form PCT/ISA/237) conducted in Int'l Appln. No. PCT/EP2021/053437 (May 11, 2021).
Int'l Prelim. Exam. Report (Form PCT/IPEA/409) conducted in Int'l Appln. No. PCT/EP2021/053437 (Jan. 26, 2022).

* cited by examiner

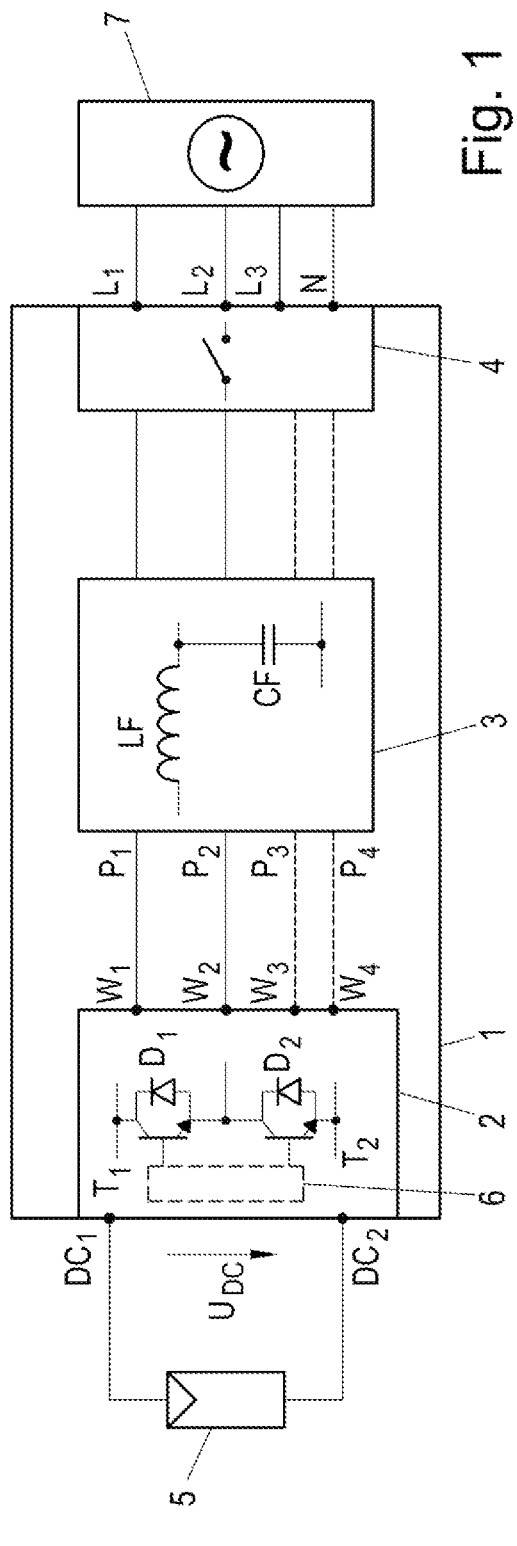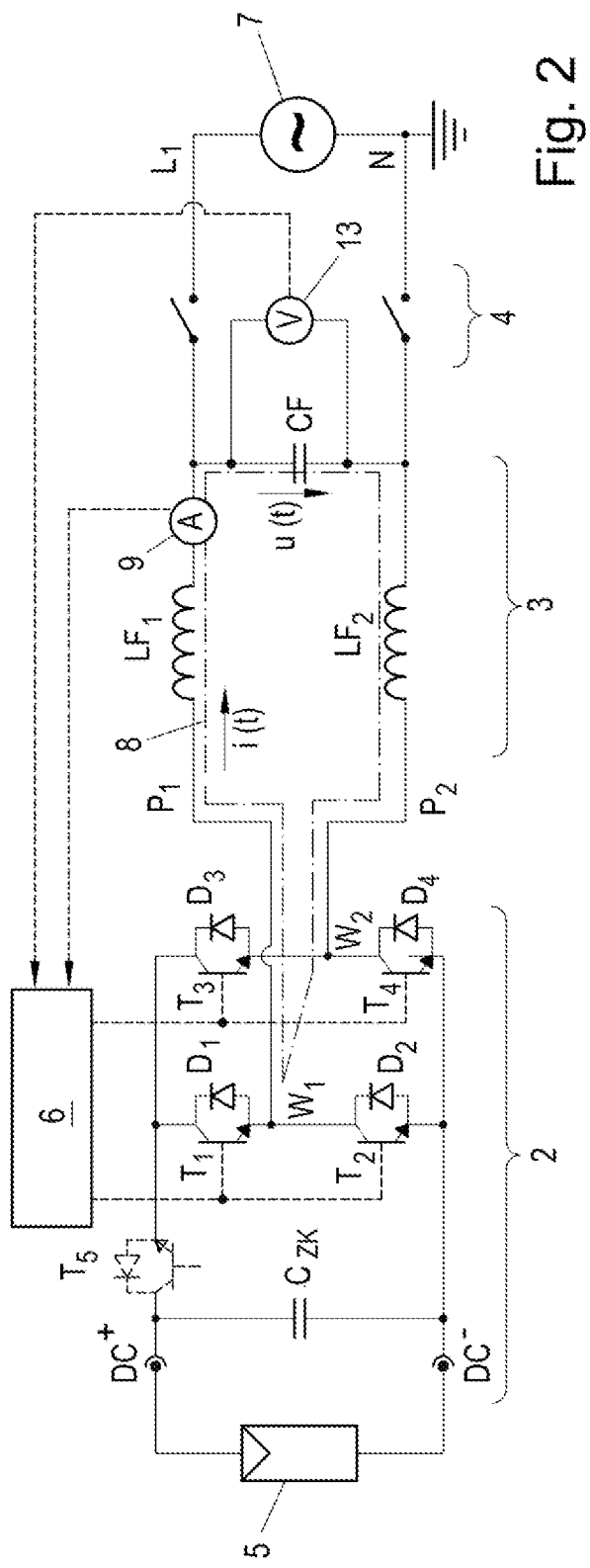

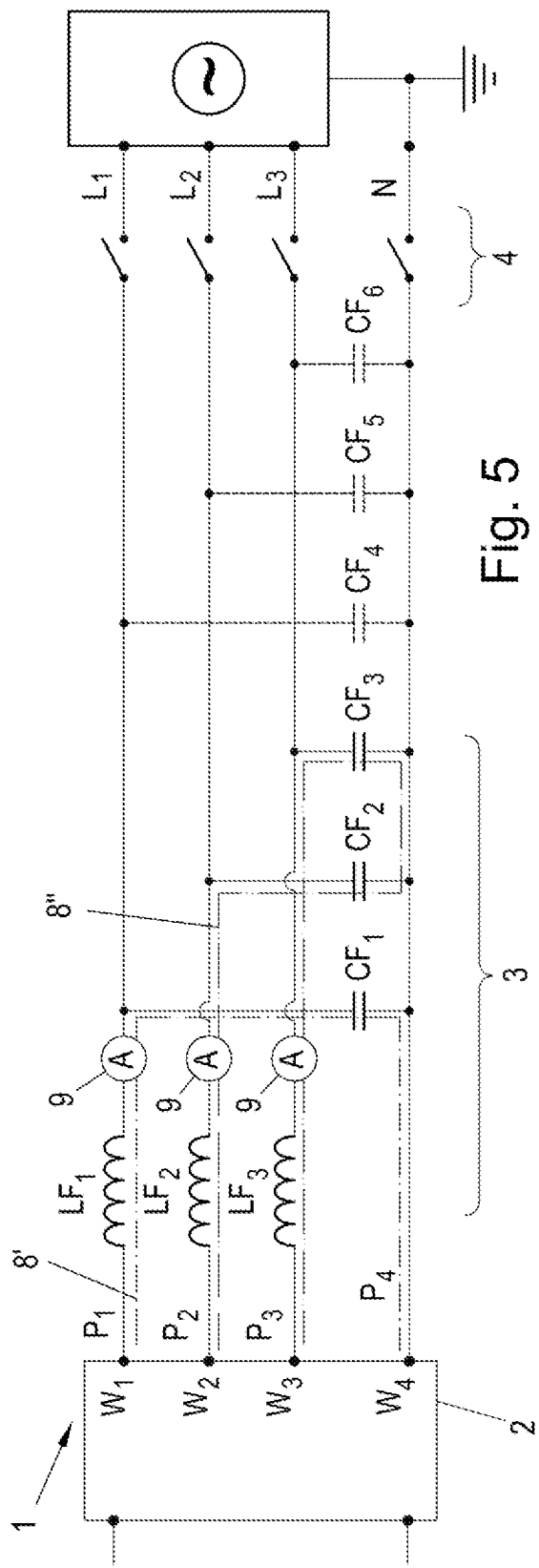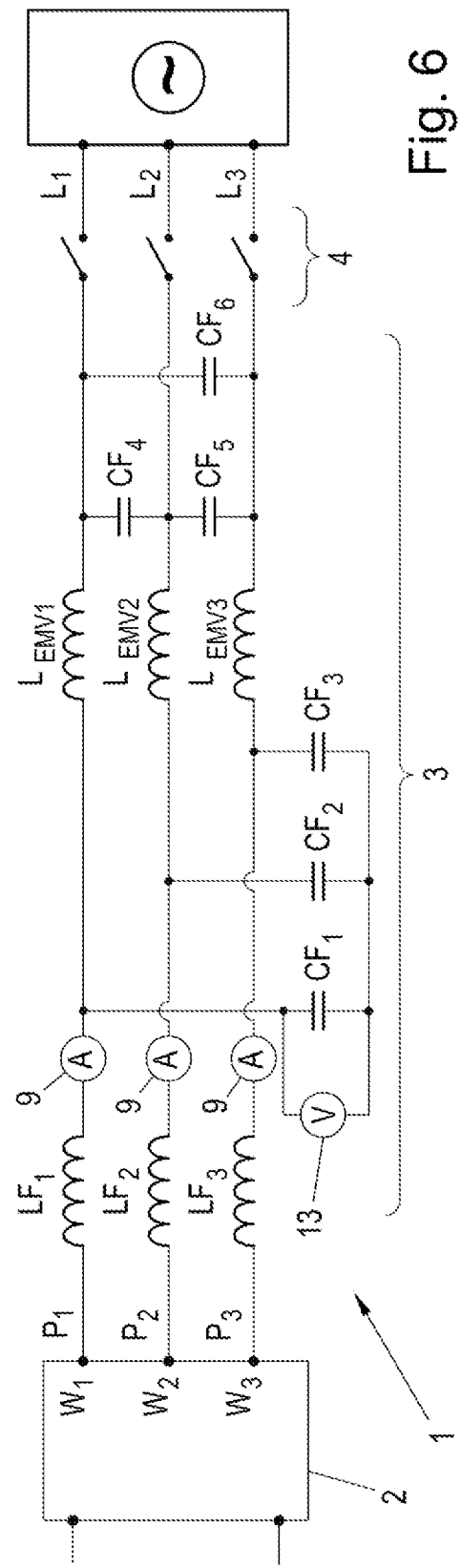

DETERMINATION OF FILTER PARAMETERS IN AN INVERTER

The present invention relates to a method for controlling a switching arrangement of an inverter with a control, and to an inverter with a corresponding system control with a control.

The switching arrangement of inverters usually includes a bridge circuit, for example in the form of an H bridge or similar topologies, which generates an alternating current at the alternating current side in the corresponding alternating current-carrying lines by the clocked switching of the semiconductor switches contained therein. The switching arrangement can be controlled, for example, in the sense of a pulse width modulation in order to achieve a good approximation of a desired alternating current form (usually a sinusoidal form).

Since only rectangular pulses can be generated by the switching arrangement, the switching arrangement is followed by a filter stage in each phase, which smooths the alternating current signal via an arrangement of capacitors and chokes (inductances) to approximate the desired sinusoidal form.

The theoretical foundations for such filter stages are well known and do not constitute an obstacle to optimizing the nominal values of these components. However, in practice there are frequently problems. In particular, the actual specific values of the components often differ from the known nominal value and the specific values can change over time due to aging or changing environmental conditions.

For example, a filter stage in a single-phase or two-phase inverter can consist of at least one inductance and at least one capacitor. Three-phase inverters usually have at least three capacitances and three inductances. The specific values of these components have a great influence on the control behavior and the oscillation tendency of an inverter, because these components are system parameters of the control and thus influence the control behavior.

The capacitor also has an influence on the control of the reactive power of the inverter. The specific values of these components are stored in the control of the inverter and influence the controller parameters of the implemented controller. If the control is now based on incorrect or inaccurate specific values, unwanted oscillations, stability problems and deviations in reactive power can result. For example, if the specific values are incorrect, harmonics and distortions in the alternating current cannot be compensated for.

In order to be able to comply with the narrow limit values of the reactive power output of the various national guidelines and to be able to control the inverter optimally, precise knowledge of the component values and thus of the system parameters of the filter stage is required.

The component values are usually measured when the inverter is manufactured and stored as parameters in the control. These work steps are relatively complex and no aging effects or other operating influences that change the component values (e.g. temperature influences) can be mapped. In order to achieve a specified reactive power output, an additional current measurement can be carried out at the grid-side output of the inverter, but this involves considerable effort.

With currently known methods from the prior art, it is possible to determine exact component values of capacitances and inductances. These methods are usually only suitable for a specific topology. In addition, these methods also reach their limits as the number of components increases.

EP 3232217 A1 discloses a method for determining current values of filter capacitances, wherein when a filter capacitance is charged an oscillating circuit is produced via the semiconductor switches which includes the filter capacitance(s). The oscillation in the oscillating circuit driven by the initially charged filter capacitance is evaluated to determine a current value of this filter capacitance. The values of the filter inductances required for the determination are assumed to be unchangeable and known. Determining the filter capacitances is used to monitor the condition of the filter capacitances. In particular, a comparison with stored nominal values is used to check whether or not the filter capacitances are still ready for use. Control of the switching arrangement cannot be improved in this way.

EP 3069158 B1 discloses a method for determining capacitance values of capacitances in a power supply system, in which a three-phase inverter is operated with open grid relays to set up an island grid. At least two outputs of an inverter bridge are supplied with an in-phase AC voltage. Current capacitance values of the filter capacitances and/or intermediate circuit capacitances are determined from the currents flowing at the outputs of the inverter bridge and at least one voltage present at the intermediate circuit capacitance and/or a filter capacitance. Here, too, the determination of the capacitance values serves to check a operability of the filter capacitances. Control of the switching arrangement cannot be improved in this way.

One of the objects of the present invention is to provide a method by which the control of the switching arrangement of an inverter with a filter circuit can be improved.

According to a first aspect, these and other objects are achieved by a method according to claim 1 and by an inverter with a corresponding control according to claim 10.

This method allows the system parameters of the filter circuit to be determined for a large number of different inverter and filter circuit topologies. For this purpose, an overall effect of one or more combinations of interconnected components is determined without having to know a specific combination or individual component values. The current curve can be measured at one of the inductances, for example. The determination of a voltage curve can preferably be measured between the two conductors involved in the oscillating circuit or from one of the conductors with respect to another reference potential, for example a star center point or an intermediate circuit center point. Knowledge of the effective filter inductance and filter capacitance is sufficient for the control. In this way, the control can be adapted to changing component values in the filter circuit, so that changing control behavior of the inverter can be compensated for.

The method steps of applying a voltage pulse, producing an oscillating circuit and determining and evaluating a current and/or voltage curve can advantageously be repeated on a plurality of different pairs of conductors. In this way, the effective filter inductance and filter capacitance of each phase can be determined, particularly in the case of multi-phase inverters. If required, more detailed component values of the electrical components of the filter circuit can also be determined in such an embodiment. Energy stored in an intermediate circuit capacitor can be used for the voltage pulse.

At least one current value of an effective filter capacitance of the filter circuit and at least one current value of an effective filter inductance of the filter circuit are advantageously determined as system parameters. In the context of the present disclosure, "effective" filter capacitance or filter inductance is either a currently determined value corresponding to an individual component of a filter circuit or a currently determined value corresponding to a calculated component of an equivalent circuit of the filter circuit, depending on whether the filter circuit in question is responsible for the determination of a value of an actual component, or whether only the values of an equivalent circuit can be determined. "Effective" filter capacitances or filter inductances can be further related to one another via mathematical dependencies in order to convert them into an effective value that can be used for the control.

Depending on the topology of the inverter, different conductors can be used to determine the effective filter inductance and effective filter capacitance. In an inverter with a conductor provided for the feedback from the filter arrangement to the switching arrangement, one of the other conductors of the inverter is advantageously used as the first conductor and the conductor provided for the feedback from the filter arrangement to the switching arrangement is used as the second conductor. This allows the effective values of the individual phases to be determined directly. Undesirable clamping can also be prevented in this case when determining the effective filter inductance and filter capacitance.

In the case of an inverter without a conductor provided for the feedback from the filter arrangement to the switching arrangement, one of the available conductors of the inverter is advantageously used as the first conductor and another of the available conductors of the inverter is used as the second conductor. In principle, this is also possible with an inverter with a neutral conductor connection. In order to prevent undesired clamping, it can be provided that a conductor of the inverter that is not used for determining the effective filter inductance and filter capacitance is connected to an intermediate circuit potential via the switching arrangement. A free-floating potential of this unused conductor, which can lead to clamping, can thus be prevented. This enables the effective filter inductance and filter capacitance to be determined more precisely.

A conductor provided for the feedback from the filter arrangement to the switching arrangement is a conductor which is either not connected to the grid relay at all or is connected to a neutral conductor of the power grid via the grid relay.

A resonant frequency of the oscillating circuit can advantageously be determined from the current and/or voltage curve, wherein a value of an effective filter inductance can be determined according to the formula $$L_m = \frac{1}{2 \cdot \pi \cdot f_{reso}} \cdot \frac{U}{I}.$$

A resonant frequency of the oscillating circuit can advantageously be determined from the current and/or voltage curve, wherein a value of an effective filter capacitance is determined according to the formula $$C_m = \frac{1}{2 \cdot \pi \cdot f_{reso}} \cdot \frac{I}{U}.$$

In an advantageous embodiment of the method, a decay behavior can be determined and taken into account in the control. In this way, for example, the quality factor or the damping of the oscillating circuit can be calculated. The associated ohmic resistance of the oscillating circuit can also be determined from this and can be used for the control. The decay behavior can be taken into account, for example, when designing the controller of the control, for example when determining the controller parameters.

In a further advantageous embodiment, a closed oscillating circuit can be produced immediately after the voltage pulse. As a result, an oscillation can be generated in the oscillating circuit even when the capacitors are completely discharged. In connection with the present disclosure, "immediately after the voltage pulse" refers to a period of time during which no relevant changes in the voltage and current states have occurred in the components involved. This is particularly the case when the corresponding values between the end of the voltage pulse and the production of the oscillating circuit have changed by less than 10%, based on their total fluctuation range.

In a further aspect, the present disclosure relates to a correspondingly designed inverter for connection to a power grid via the grid relay.

The present disclosure also relates to a computer program with program code for carrying out the method steps described above when the computer program is executed on a system control of an inverter. In this case, the computer program can advantageously determine a topology of the inverter before carrying out the method steps. The topology of the switching arrangement of the inverter can be selected, for example, from H5. HERIC, REFU, FB-DCBP, FB-ZVR, NPC, Conergy-NPC and topologies related to these. The topologies denoted in this way are known in the art and therefore do not need to be explained in more detail here.

A person skilled in the art will be able to apply the teachings disclosed herein to all of the topologies mentioned. This also allows the same computer program to be used in a large number of different inverters and also facilitates remote maintenance of the inverters.

The present invention is explained in more detail below with reference to FIG. 1 to 11, which schematically show advantageous embodiments of the invention by way of example and in a non-limiting manner. In the drawings:

FIG. 1 shows an inverter in a schematic, generic representation,

FIG. 2 is a schematic view of a circuit of an inverter,

Figure 3:
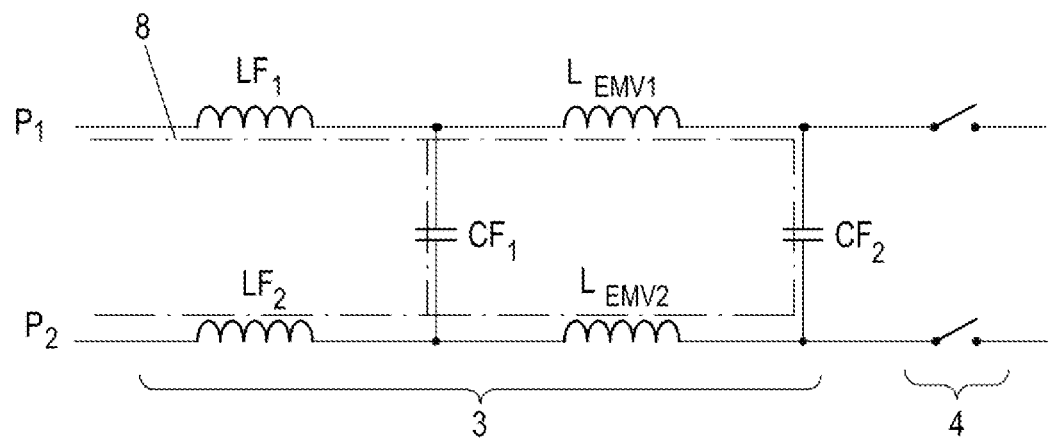
Figure 4:
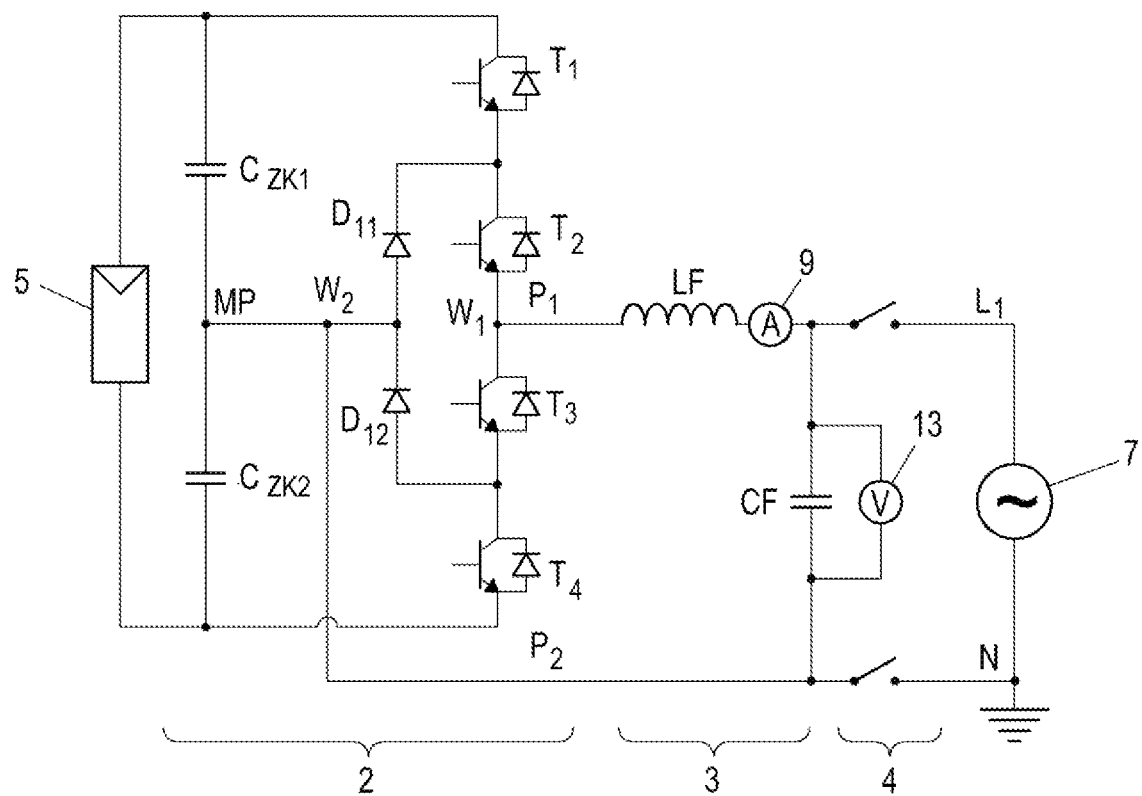
Figure 7:
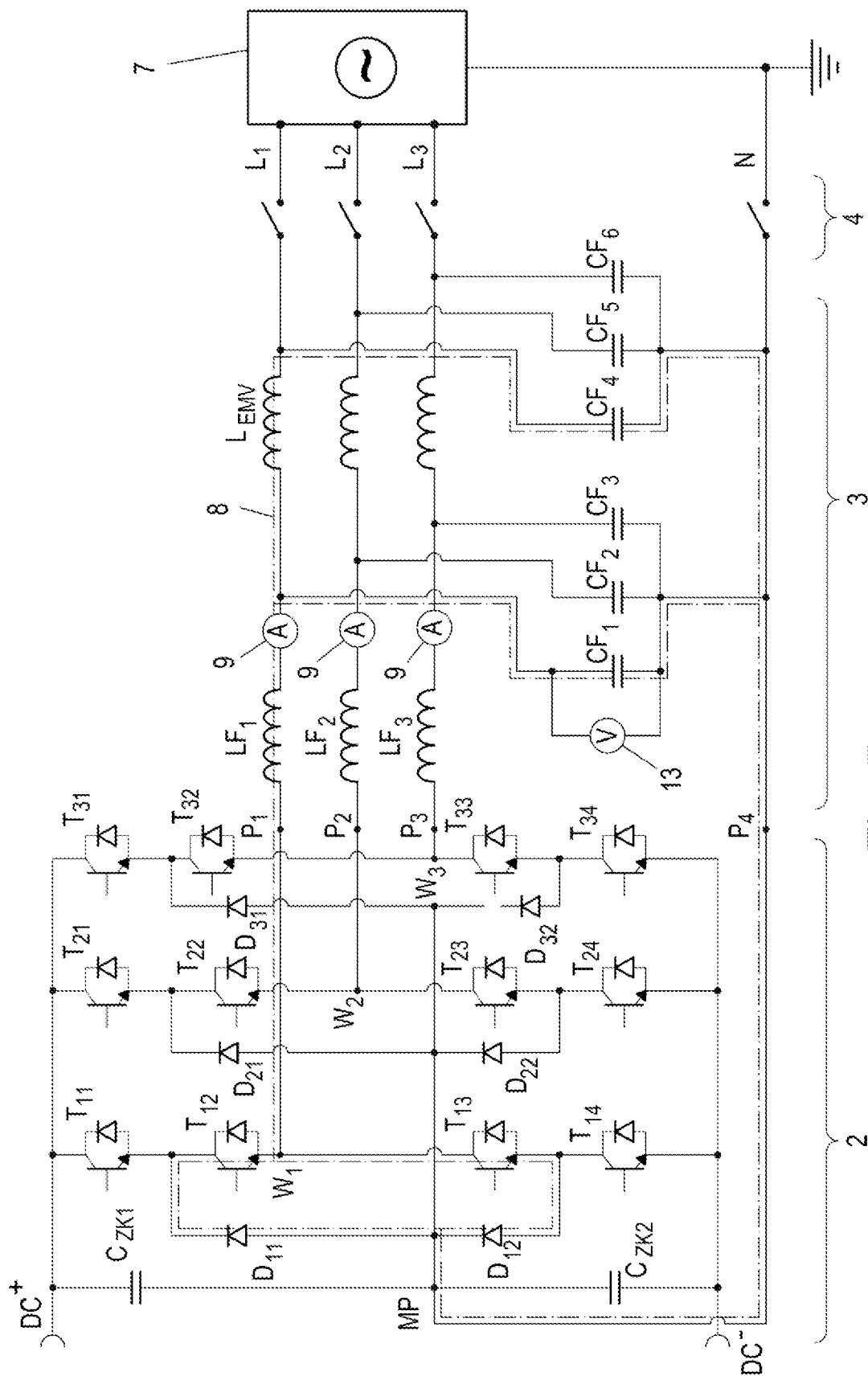
Figure 8:
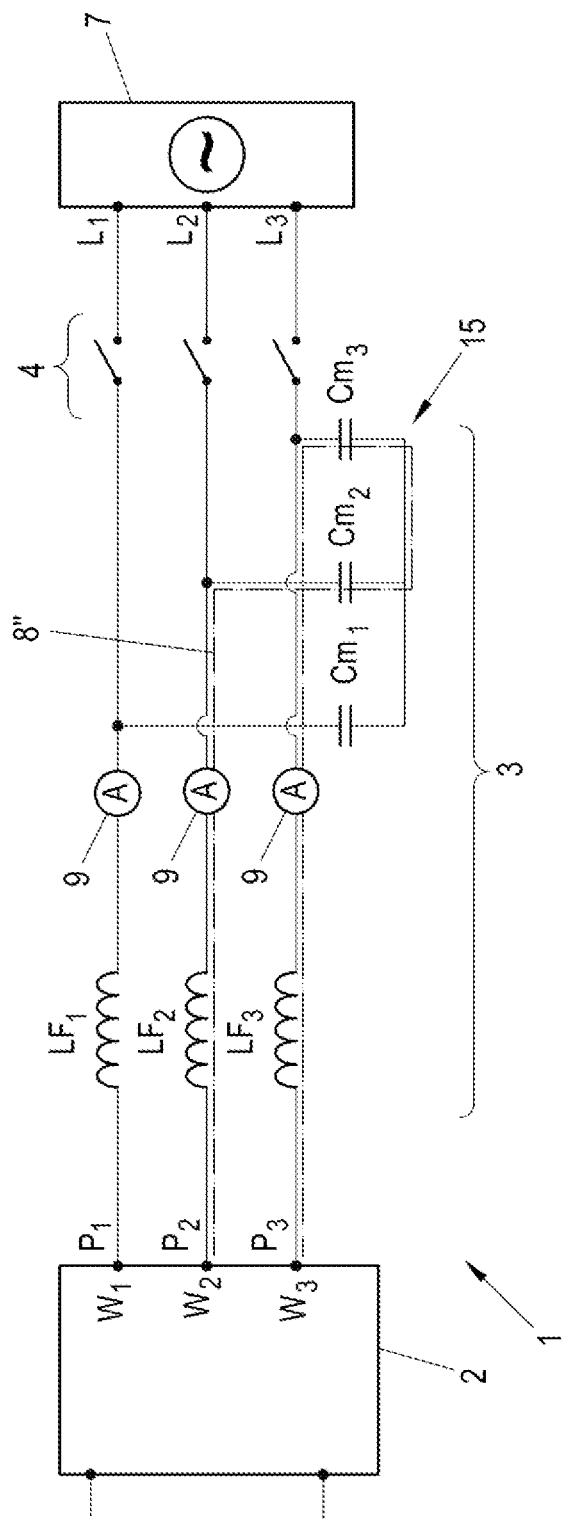
Figure 9:
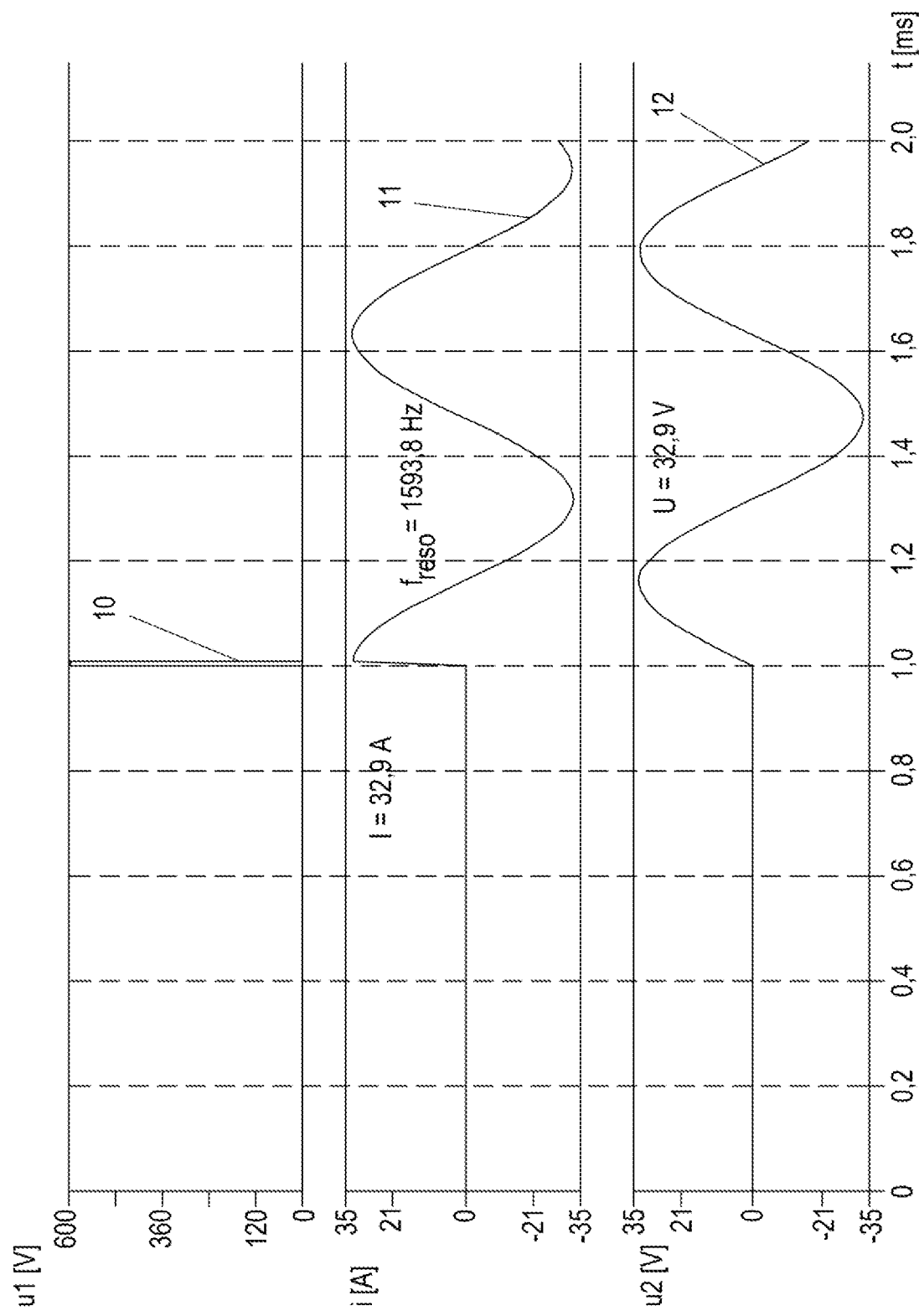
Figure 10:
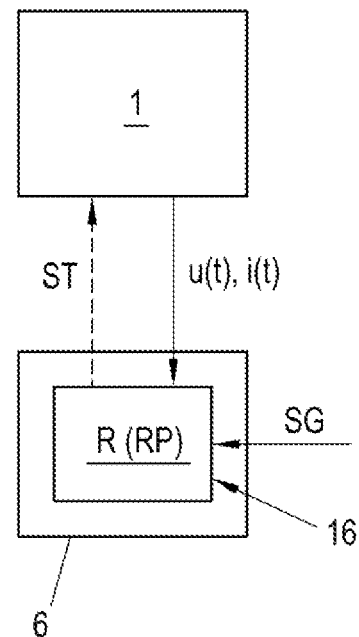
Figure 11:
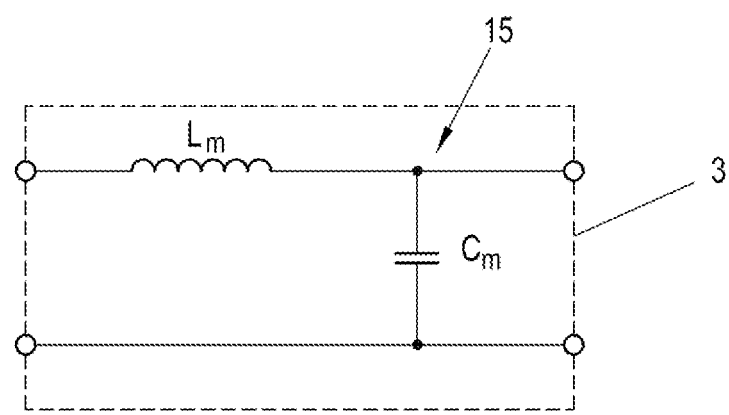

FIG. 3 shows part of a circuit of an inverter with an alternative embodiment of a filter circuit, FIG. 4 is a schematic representation of a further circuit of an inverter, FIG. 5 is a schematic representation of a circuit of an inverter with four conductors that can be connected to the line conductor and a neutral conductor of a power grid, FIG. 6 is a schematic representation of a circuit of an inverter with three conductors, FIG. 7 is a further schematic representation of a circuit of an inverter with four conductors, FIG. 8 is a schematic representation of an equivalent circuit with equivalent total capacitances, FIG. 9 shows a schematic representation of the voltage pulse, current curve and voltage curve as they can result, for example, for the method in question, FIG. 10 shows a control of an inverter and FIG. 11 shows an equivalent circuit of a filter circuit.

FIG. 1 shows an inverter 1 which converts a direct current (DC) voltage generated by a DC voltage source 5 into an alternating current (AC) voltage which can be fed into a power grid 7 (also as an island grid). The inverter 1 of FIG. 1 has a three-phase design with three phases L1, L2, L3 and a neutral conductor N.

The DC voltage source 5 generates a potential difference $U_{DC}$ which is applied to a switching arrangement 2 of the inverter 1 via two inputs $DC_1$ and $DC_2$ on the DC side. Depending on the system, inputs $DC_1$, $DC_2$ on the DC side can come directly from the DC voltage source 5 or from an upstream DC voltage converter or MPP tracker. The switching arrangement 2 comprises, in a known manner, an intermediate circuit consisting of at least one intermediate circuit capacitor $C_{ZK}$ (not shown) and a plurality of semiconductor switches T, which are clocked via a system control 6 according to a modulation scheme. Freewheeling diodes D are usually arranged in parallel with the semiconductor switches T. The semiconductor switches T are often arranged in the form of half-bridge circuits, wherein at least one half-bridge consisting of at least two series-connected semiconductor switches T is provided per phase. The alternating voltage thus generated can be applied to corresponding conductors P via one or more conductor outputs W of the switching arrangement 2. At least one conductor P is provided for each phase of the inverter, wherein a plurality of conductor outputs W can be combined to form one phase (so-called interleaved inverter topologies).

The conductors P are routed via a filter circuit 3 to a grid relay 4, wherein with the grid relay 4 closed the conductors P of the inverter 1 are connected to the corresponding conductors of the power grid 7 (i.e., for example, phase or line conductors $L_1$, $L_2$, $L_3$ and neutral conductor N, and if necessary a protective conductor can also be taken into account).

Conductors P, to which an alternating current can be applied via the switching arrangement 2, are also referred to as "phase conductors" in connection with the present description. In connection with the present disclosure, both phase conductors or line conductors and also neutral conductors are generally referred to as "conductors". If a distinction between phase conductors and neutral conductors is useful or necessary, this is explicitly stated in the text unless it is logically and compellingly derivable from the context.

The filter circuit 3 generally comprises at least one filter inductance LF (choke) which is arranged in a conductor P directly following the corresponding conductor output W, and at least one filter capacitance CF which, preferably "behind" the filter inductance LF (i.e. between the filter inductance LF and the grid relay 4), connects two conductors P to each other. If necessary, in the case of multi-phase topologies, the connection can be made via a star center point and a further filter capacitance CF.

In connection with the present disclosure, components and elements that appear multiple times in a similar or identical form in a drawing are identified by a combination of capital letters identifying the element (e.g. DC-side input DC, semiconductor switch T, conductor output W, conductor P, filter inductance LF, filter capacitance CF, etc.) and numbered by subscript indices. This differentiation is only for better distinguishability and is not to be interpreted restrictively.

Depending on the embodiment of the inverter 1, it can be equipped with two, three or four conductors P. Inverters with two conductors $P_1$, $P_2$ can, for example, be connected to two phases $L_1$, $L_2$ of the power grid 7 or to one phase L and the neutral conductor N. Inverters 1 with three conductors $P_1$, $P_2$, $P_3$ can, for example, be connected to the three phases $L_1$, $L_2$, $L_3$ of a three-phase power grid 7. Inverters 1 with four conductors $P_1$, $P_2$, $P_3$, $P_4$ can, for example, be connected to the three phases $L_1$, $L_2$, $L_3$ of a three-phase power grid 7 and to its neutral conductor N.

The present disclosure is not limited to a specific topology of the inverter 1, in particular the switching arrangement 2 and the filter circuit 3. Rather, the teachings disclosed herein can be applied to a variety of different topologies provided certain conditions are met, which are exemplified below with reference to some specific circuits set out in more detail.

The inverter 1, specifically the switching arrangement 2 of the inverter 1, is controlled by a control 16, as shown in simplified form in FIG. 10. The control 16 is implemented in a system control 6, preferably microprocessor-based hardware, preferably as software. However, the system control 6 with the control 16 can also be designed as an integrated circuit, for example as an application-specific integrated circuit (ASIC) or field programmable gate array (FPGA), or as an analog circuit.

A controller R(RP) with controller parameters RP is provided for the control 16, wherein the controller parameters RP are adapted to the system parameters SP of the system to be controlled in order to achieve the desired control behavior. The filter circuit 3 influences the control 16 of the inverter 1, so that the system parameters SP derived from it are taken into account in the control 16, specifically in the controller R, for example in the form of a controller parameter RP or in that the system parameters SP influence the value of a controller parameter RP. In addition to the system parameters SP, which are derived from the filter circuit 3, other system parameters can of course also be taken into account in the control 16. The design of a controller R with a predetermined control rule (e.g. PI controller, PID controller, etc.), on the basis of which the controller parameters RP and their dependence on the system parameters SP are defined, is well known to a person skilled in the art so that it does not need to be discussed further. In order to control the inverter 1, specifically the switching arrangement 2 or the semiconductor switches T of the switching arrangement 2, the controller R determines manipulated variables ST for the switching arrangement 2 in dependence of a predefined setpoint variable SG, for example a desired current per phase or a desired voltage per phase, for example, switching commands for the semiconductor switch T or a duty cycle of a pulse width modulation (PWM) control, which are then converted into switching commands.

To control the inverter 1, for the filter circuit 3 for each phase of the inverter 1 use is made of an equivalent circuit consisting of an effective filter inductance $L_m$, which results from the at least one filter inductance LF of the phase of the filter circuit 3 and the topology of the filter circuit 3, and an effective filter capacitance $C_m$, which results from the at least one filter capacitance CF of the phase of the filter circuit 3 and the topology of the filter circuit 3 (FIG. 11). The effective filter capacitance $C_m$ and the effective filter inductance $L_m$ are system parameters SP for the control 16 of the switching arrangement 2 and are determined from measured values of an electrical current i(t) and an electrical voltage u(t) as described below, for example in the system controller 6.

FIGS. 2 and 4 show an example of an inverter 1 for connection to a line conductor $L_1$ and a neutral conductor N, for which system parameters such as the effective filter capacitance $C_m$ and the effective filter inductance $L_m$ are determined.

FIG. 2 shows an embodiment of an inverter 1 with a conventional H-bridge circuit, in which the potential difference $U_{DC}$ between a high potential (positive pole DC$^+$) and a low potential (negative pole DC$^-$) can be applied via four semiconductor switches $T_1$-$T_4$ to the two conductor outputs $W_1$ and $W_2$ in different ways. In this embodiment, a phase $L_1$ is connected to the conductor output $W_1$ and the neutral conductor N of the power supply system 7 is connected to the conductor output $W_2$. During operation, the semiconductor switches T are controlled via a system controller 6 according to a modulation scheme, wherein four switching states can be used:

positive current flow: $T_1$ and $T_4$ closed, $T_3$ and $T_2$ open
negative current flow: $T_2$ and $T_3$ closed, $T_1$ and $T_4$ open
zero volts over DC$^+$: $T_1$ and $T_3$ closed, $T_2$ and $T_4$ open
zero volts over DC$^-$: $T_2$ and $T_4$ closed, $T_1$ and $T_3$ open Corresponding modulation schemes are well known in the art and it is therefore not necessary to describe them in detail here.

Irrespective of the topology, the circuit of the semiconductor switches T generates a rectangular alternating current at the conductor outputs W according to a modulation scheme, and this alternating current must be converted into a sine wave that runs as smoothly as possible before it is fed into the power grid 7. This is ensured by the filter circuit 3 and the filter inductances $LF_1$, $LF_2$ and the filter capacitance CF provided therein. The specific filter topology of the filter circuit 3 and the specific values of the filter capacitances CF and filter inductances LF present in the filter give the filter circuit 3 a specific filter behavior that can be described by the component values. The values depend on the particular frequency, wherein for the control of the switching arrangement 2 not only the behavior at the frequency of the alternating current (typically, for example 16.7 Hz, 50 Hz, 60 Hz), but possibly also at interference frequencies and/or at frequencies that are used for ripple control signals from the grid operator, can be taken into account. When the inverter 1 is in operation, reactive currents, which are to be controlled by the control in the system control 6, flow through the filter capacitance CF. The filter capacitance CF and the filter inductances LF1. LF2 thus influence the control of the inverter 1.

In order to increase the accuracy of the reactive power value to be adjusted by the control and/or to optimize the control 16 of the system control 6, it is therefore essential to know the specific values of the system parameters SP for the control of the switching arrangement 2 as precisely as possible. However, these system parameters SP, or the components of the filter circuit 3, which are comprised in the system parameters SP for the control, are subject to changes caused by aging or changes in the environmental influences.

Depending on the topology of the filter circuit 3, the individual component values of the filter capacitance(s) CF and the filter inductance(s) LF can only be determined with great effort. For the control 16 according to the invention, an equivalent circuit 15 of the filter circuit 3 with an effective filter capacitance $C_m$ and an effective filter inductance $L_m$ is therefore used for each phase, as shown by way of example in FIG. 11. In the equivalent circuit 15 for one phase of the inverter 1, all filter inductances LF of the phase are combined in the effective filter inductance $L_m$ or are disregarded ($L_{emv}$). Likewise, all filter capacitances CF of the phase are combined in the effective filter capacitance $C_m$. It is obvious that the way in which this combination has to be done depends on the topology of the filter circuit 3. However, a person skilled in the art in this field can in any case determine the effective filter capacitance $C_m$ and the effective filter inductance $L_m$ of the equivalent circuit 15 from a specific filter circuit 3. The control 16, specifically the controller parameters RP of the controller R of the control 16, is designed using the equivalent circuit 15.

A method by which the current system parameters SP of the filter circuit 3 of the inverter 1 can be determined quickly, easily and precisely is described below with reference to the circuit shown in FIG. 2. Optimally, the method can be carried out immediately before the inverter 1 is connected to the power grid 7 by closing the grid relay 4. The system parameters SP can thus be determined, for example, regularly or as required before the grid relay 4 is closed or after the grid relay 4 has been opened, whereby current system parameters SP can always be determined and taken into account in the control. A change in the system parameters SP can therefore be continuously taken into account in the control.

The method is carried out with the grid relay 4 open, i.e. the inverter 1 is disconnected from the power grid 7, or from its line conductors $L_1$, $L_2$, $L_3$ and neutral conductor N, and all the semiconductor switches T are open. By brief closure of the first and fourth semiconductor switches $T_1$ and $T_4$, for example for a period of a few microseconds (e.g. 5 microseconds), a voltage pulse is applied to the conductor outputs $W_1$ and $W_2$ because an intermediate circuit voltage is applied for this period. Alternatively, the voltage pulse can also be generated with the opposite polarity by closure of the second and third semiconductor switches $T_2$ and $T_3$. Immediately afterwards, the conductor outputs $W_1$ and $W_2$ are connected in the switching arrangement 2, so that an oscillating circuit 8 is produced, which, starting from the first conductor output $W_1$, runs via the first line $P_1$, the first filter inductance $LF_1$, the filter capacitance CF, the second line $P_2$, the second filter inductor $LF_2$ to the second conductor output $W_2$ and is closed by the connection between $W_1$ and $W_2$. The oscillating circuit 8 is indicated in FIG. 2 by a dash-dot line. In the topology shown, the connection between $W_1$ and $W_2$ can be established either by closing the "upper" semiconductor switches $T_1$ and $T_3$ or by closing the "lower" semiconductor switches $T_2$ and $T_4$. In many topologies, however, it is also possible to connect the conductor outputs W to one another without a potential difference being present at them. If necessary, further semiconductor switches can be provided for this purpose, such as the semiconductor switch $T_5$ shown in dashed lines, by which the bridge circuit can be separated from the positive pole DC*.

If the filter capacitance CF is charged before the voltage pulse is applied, problems with overcurrent, for example if the capacitor is charged too highly, can be prevented with an advantageous embodiment of the method. In principle, an overcurrent can be avoided with a sufficiently short voltage pulse and, in addition, with an appropriately selected polarity. In a further embodiment of the method, the filter capacitance CF is discharged before the voltage pulse is applied in order to rule out an overcurrent and to be able to carry out a repeated determination of the system parameters under comparable conditions.

Even if the filter capacitance CF is completely discharged at the beginning, a free oscillation forms immediately after the voltage pulse in the oscillating circuit 8, which can be determined as a current curve i(t) (e.g. current measurement 9 at the first or second filter inductance LF1, LF2) and a voltage curve u(t) (voltage measurement 13 across the filter capacitance CF). The frequency of the current curve (and voltage curve) corresponds to the resonant frequency $f_{reso}$ of the oscillating circuit 8. The resonant frequency $f_{reso}$, the voltage amplitude U and the current amplitude I can thus be determined from the current curve i(t) and the voltage curve u(t). An effective filter inductance $L_m$ and an effective filter capacitance $C_m$ can be determined for the filter circuit 3 from these values.

Using the law of conservation of energy applied to the oscillating circuit 8 with the equivalent circuit 15 of the filter circuit 3

$$L_m \cdot I^2 = C_m \cdot U^2 \quad \text{(Eq. 1)}$$

and the Hertz oscillation equation $$f_{reso} = \frac{1}{2\pi\sqrt{L_m \cdot C_m}} \quad \text{(Eq. 2)}$$

results for the effective filter inductance $$L_m = \frac{1}{2 \cdot \pi \cdot f_{reso}} \cdot \frac{U}{I} \quad \text{(Eq. 3)}$$

and the effective filter capacitance $$C_m = \frac{1}{2 \cdot \pi \cdot f_{reso}} \cdot \frac{I}{U}. \quad \text{(Eq. 4)}$$

The effective filter inductance $L_m$ and effective filter capacitance $C_m$ can result from a single or multiple physical component(s) of a filter circuit 3.

In the simple filter circuit 3 shown in FIG. 2, the determined effective filter capacitance $C_m$ corresponds to the current value of the filter capacitance CF. The effective filter inductance $L_m$ corresponds to the sum of the two filter inductances $LF_1$ and $LF_2$.

The quality or the damping of the oscillating circuit 8 can be calculated by determining the decay behavior of the free oscillation. The associated ohmic resistance can also be determined from this. Quality or damping of the oscillating circuit 8 and ohmic resistance can subsequently be used as further parameters for controlling the inverter 1 for generating alternating current and alternating voltage or for control optimization.

It is obvious that for the determination of the effective filter capacitance $C_m$ and the effective filter inductance $L_m$ in an inverter 1 as in FIG. 2, it is irrelevant whether it is connected to a phase conductor $L_1$ and a neutral conductor N (as in FIG. 2) or to two phase conductors $L_1$, $L_2$. When the grid relay 4 is open, there are only the conductors P of the inverter 1, which are used to form an oscillating circuit 8. Likewise, the specific design of the switching arrangement 2 is not decisive for this.

As explained with reference to FIG. 3, the above method can also be applied to more complex filter circuits 3. The filter circuit 3 comprises a filter inductance $LF_1$ in the first conductor $P_1$ and an EMC choke $L_{EMV1}$ as the second inductance for damping high-frequency interference. The second conductor $P_2$ also includes an EMC choke $L_{EMV2}$ in addition to the 25 second filter inductance $LF_2$. Instead of a single filter capacitance CF, two parallel filter capacitances $CF_1$ and $CF_2$ are arranged in the filter circuit 3, wherein the two EMC chokes $L_{EMV}$ are arranged between the first filter capacitance $CF_1$ and second filter capacitance $CF_2$. The remaining circuit of the inverter 1, which is not shown in FIG. 3, can correspond to FIG. 2, for example.

The oscillating circuit 8 of FIG. 3 is thus divided between the two filter inductances $LF_1$ and $LF_2$ into two parallel branches, wherein the first branch comprises the first filter capacitance $CF_1$ and the second branch comprises in series the first EMC choke $L_{EMV1}$, the second filter capacitance $CF_2$ and the second EMC choke $L_{EMV2}$.

With regard to the method described above for determining the system parameters SP, the EMC chokes $L_{EMC}$ can be disregarded in the calculation. Since EMC chokes are usually designed for a significantly higher frequency than the filter inductances LF and are comparatively very small, this does not result in any disadvantages. The EMC chokes have a negligible influence on the oscillating behavior of the oscillating circuit 8. The effective filter inductance $L_m$ for the equivalent circuit 15 can thus be determined in a manner analogous to the method described above, and again it corresponds to the sum of the two filter inductances $LF_1$ and $LF_2$. The effective filter capacitance $C_m$ can also be determined in an analogous manner and corresponds in this case to the sum of the two parallel filter capacitances $CF_1$ and $CF_2$.

Knowledge of the effective filter capacitance $C_m$ and effective filter inductance $L_m$ is sufficient for the control 16 of the switching arrangement 2, so that the additional effort for determining the individual values of the parallel filter capacitances $CF_1$ and $CF_2$ and the two filter inductances $LF_1$ and $LF_2$ is not necessary and can be omitted.

FIG. 4 shows a further example in the form of a multi-level inverter 1, wherein the switching arrangement 2 in this case corresponds to a so-called "NPC topology". "NPC" stands for "neutral point clamped," which means that a conductor output W of the switching arrangement 2, in the illustrated case the second conductor output $W_2$, to which the second conductor $P_2$ is connected, is connected to the intermediate circuit center point MP between two intermediate circuit capacitors $C_{ZK1}$, $C_{ZK2}$. The second conductor $P_2$ is connected to the filter circuit 3 and, in this embodiment, is connected to the neutral conductor N of the power grid 7 when the grid relay 4 is closed. Due to the topology of the switching arrangement 2, more than two voltage levels (DC+, DC−) can now be set at the conductor output $W_1$ of the switching arrangement, to which the first conductor $P_1$ is connected. In the embodiment according to FIG. 4, the voltage level 0 can now also be set via the internal semiconductor switches $T_2$, $T_3$ and the clamp diodes $D_{11}$, $D_{12}$. The four semiconductor switches $T_1$ to $T_4$ of the NPC semiconductor bridge can be switched into the following states in particular:

positive current flow: $T_1$ and $T_2$ closed, $T_3$ and $T_4$ open
negative current flow: $T_3$ and $T_4$ closed, $T_1$ and $T_2$ open
freewheeling (zero volt) via the two freewheeling diodes:
$T_2$ and $T_3$ closed, $T_1$ and $T_4$ open To determine the system parameters SP, again a voltage pulse is applied to a conductor output $W_1$, $W_2$ (for example by closing the two "upper" semiconductor switches $T_1$ and $T_2$ or the two lower semiconductor switches $T_3$ and $T_4$) with the grid relay 4 open, because an intermediate circuit voltage is present and immediately afterwards, by opening the two outer semiconductor switches $T_1$, $T_4$ and closing the two middle semiconductor switches $T_2$ and $T_3$, the first conductor output $W_1$ is connected via one of the two clamp diodes $D_{11}$, $D_{12}$ to the second conductor output $W_2$ and an oscillating circuit 8 is produced.

The system parameters SP are again determined according to the method described above, wherein only one filter inductance LF and one filter capacitance CF have to be taken into account in this case. Thus, the values of the individual filter components can be determined directly. The effective filter capacitance $C_m$ to be taken into account by the control corresponds to the current value of the filter capacitance CF and the effective filter inductance $L_m$ corresponds to the current value of the filter inductance LF. However, more complex topologies of the filter circuit 3 are usually provided, so that such a simple assignment is unusual and is only used for explanation.

With the aid of the teachings disclosed in connection with the description of FIG. 2 to 4 for single or two-phase inverters, the present disclosure can also be applied to numerous other one-, two- or three-phase inverters which have a different topology. Examples of such topologies include, but are not limited to, those known as H5, HERIC, REFU, FB-DCBP, FB-ZVR, NPC, Conergy-NPC, and related or similar topologies.

The present teachings can advantageously be applied to three-phase inverters 1 with a feedback from the filter circuit 3 into the switching arrangement 2 by means of a conductor $P_4$, as is explained below by way of example with reference to FIGS. 5 and 7. The conductor $P_4$ used for the feedback can also be connected to the neutral conductor N of the power grid 7 when the grid relay 4 is closed. A significant advantage lies in the fact that the method for determining the system parameters SP can be used independently of the number of capacitances.

Three-phase inverters 1 can be made, for example, by combining three single-phase inverters. On the other hand, specific circuits for three-phase inverters (with or without feedback) can also be used. The structure and the topology of one-, two- and three-phase inverters are known per se to a person skilled in the art. The topologies that are listed and described in connection with the inverters 1 mentioned above can also be used for three-phase systems by appropriate expansion of the circuit. In principle, the present disclosure is not limited to specific topologies unless specific technical reasons (such as an incompatible topology) prevent implementation of the teachings disclosed herein.

FIG. 5 shows an inverter 1 with a switching arrangement 2 with four conductor outputs $W_e$-$W_4$, wherein the corresponding first three conductors $P_1$-$P_3$ are connected to the phase conductors $L_1$-$L_3$ of the power grid 7 via the grid relay 4, and wherein the fourth conductor $P_4$ is connected to the neutral conductor N (but this is not necessary). In the first three conductors $P_1$-$P_3$, a filter inductance $LF_1$-$LF_3$ is in each case provided directly following the corresponding conductor output W and behind it a filter capacitance $CF_1$-$CF_3$ is in each case arranged between the corresponding conductor $P_1$-$P_3$ (phase conductor) and the fourth conductor $P_4$ (which serves for feedback from the filter circuit 3 to the switching arrangement 2 and is connected to the neutral conductor N when the grid relay 4 is closed), which are thus arranged in a star arrangement. The phase conductors $P_1$-$P_3$ can each be supplied with an (in particular pulse width-modulated) AC voltage from the switching arrangement 2. The fourth conductor $P_4$ for feedback can be connected in the switching arrangement 2 to an intermediate circuit center point MP between two intermediate circuit capacitances $C_{ZK1}$, $C_{ZK2}$ (comparable to the connection $P_2$ in FIG. 4).

The method for determining system parameters disclosed above in connection with single-phase or two-phase inverters 1 is basically suitable for inverters 1 that can produce an oscillating circuit 8 via a filter circuit 3 between two outputs of the switching bridge and can, for example, be applied to the filter topology of FIG. 5.

To determine the system parameters SP, one of the first three conductor outputs $W_1$-$W_3$ is first subjected to a voltage pulse. Immediately after the voltage pulse, starting from this conductor output, an oscillating circuit 8' is built up via the associated conductor P, via the filter circuit 3 and the conductor $P_4$ provided for the feedback and connected to the conductor output $W_4$. The oscillating circuit 8' can be routed via the corresponding filter inductance LF, the corresponding filter capacitance CF and the fourth conductor $P_4$ provided for the feedback, in that the corresponding conductor output $W_1$-$W_3$ is connected to the fourth conductor output $W_4$ via the switching arrangement 2. Such an oscillating circuit 8' is shown in FIG. 5 by the dash-dot line between the conductor output $W_1$ and the conductor output $W_4$. The method is analogously also used for the other conductor outputs $W_1$-$W_3$. In this way, the effective filter capacitance $C_m$ and effective filter inductance L of each phase of the inverter 1 are obtained as described above.

FIG. 7 shows a further embodiment of a three-phase inverter 1 with a conductor $P_4$ provided for the feedback from the filter circuit 3 to the switching arrangement 2, the switching arrangement 2 corresponding to a 3L-NPC (three level neutral point clamped) topology. Of the four conductors $P_1$-$P_4$, when the grid relay 4 is closed, the first three conductors $P_1$-$P_3$ are each assigned to a phase $L_1$-$L_3$ of the power grid 7 (phase conductor), and the fourth conductor $P_4$ is assigned to the neutral conductor N and connected to an intermediate circuit center point MP of the intermediate circuit. However, this connection of the conductor $P_4$ to a neutral conductor N when the grid relay 4 is closed is not mandatory.

The filter circuit 3 comprises a filter inductance $LF_1$-$LF_3$ for each conductor $P_1$, $P_2$, $P_3$. Furthermore, an EMC choke $L_E v$ is provided in each conductor $P_1$, $P_2$, $P_3$, wherein the EMC chokes $L_{EMV}$ can again be disregarded for determination of the system parameters SP, as already explained. A first star connection with three filter capacitances $CF_1$-$CF_3$ is arranged between the filter inductances $LF_1$-$LF_3$ and the EMC chokes $L_{EMV}$, and a second star connection with three further filter capacitances $CF_4$-$CF_6$ is arranged after the EMC chokes $L_{EMV}$. The star center points of the two star connections are each connected to the fourth conductor $P_4$ provided for the feedback to the switching arrangement 2.

With the switching arrangement 2 shown, either a positive potential (positive pole DC$^+$), a negative potential (negative pole DC$^-$) or the intermediate neutral potential of the intermediate circuit center point MP of the intermediate circuit can be applied in the form of a voltage pulse to each of the three conductors L (i.e. the three first conductors $P_1$-$P_3$), i.e. for each phase of the inverter 1 (the corresponding switching of the semiconductor switches T corresponds to the procedure described in connection with FIG. 4). Thus, for each phase of the inverter 1, an oscillating circuit 8 can be produced which, starting from the center point MP, runs via the two clamp diodes $D_{x1}$, $D_{x2}$ and the two middle semiconductor switches $T_{x2}$, $T_{x3}$ of the relevant phase, the conductor output W of the relevant phase, the filter inductance LF and the two parallel filter capacitances CF of the relevant phase and the fourth conductor P4 for feedback, back to the intermediate circuit center point MP.

Either a positive voltage pulse (semiconductor switches $T_{x1}$ and $T_{x2}$ closed) or a negative voltage pulse (semiconductor switches $T_{x3}$ and $T_{x4}$ closed) can be applied as the voltage pulse. After that, the oscillating circuit 8 is again produced as described above and the current and/or voltage curve is measured and evaluated. This process is performed for each of the three phases. As a result, the values of the effective filter inductance $L_m$ and the effective filter capacitance $C_m$ for each phase can be determined as system parameters SP.

In FIG. 7, the oscillating circuit 8 for the first phase, i.e. via the conductor $P_1$, is represented by a dash-dot line. The evaluation of the behavior of this oscillating circuit 8 allows to determine the value of the effective filter inductance $L_m$ in the form of the first filter inductance LF1 and of the effective filter capacitance $C_m$, which in this case corresponds to the sum of the two parallel filter capacitances $CF_1$ and $CF_4$ of this oscillating circuit 8 and is determined as a total capacitance. The effective filter inductances $L_m$ and effective filter capacitances $C_m$ of the other two phases are determined analogously. Due to the connection of the capacitor star point of the filter capacitors CF to the intermediate circuit center point MP, the effective filter inductances $L_m$ and effective filter capacitances $C_m$ of the individual phases can be easily determined with an oscillating circuit 8 formed between one of the conductor outputs $W_1$, $W_2$, $W_3$ of the conductors $P_1$, $P_2$, $P_3$ and the conductor output $W_4$ of the conductor $P_4$ provided for the feedback.

On the other hand, two "phase outputs" (i.e. two of the first three conductor outputs $W_1$-$W_3$) can also be connected to each other via the switching arrangement 2. This is possible for the examples in FIG. 5 and FIG. 7, but it is particularly suitable for the example in FIG. 6 and FIG. 8, since here there is no feedback from the filter circuit 3 to the switching arrangement 2. The corresponding oscillating circuit 8" is somewhat more complex and is shown by way of example in FIG. 5 and FIG. 6 by a dash-dot-dot line between the conductor outputs $W_2$ and $W_3$. In FIG. 5, this exemplary oscillating circuit 8" comprises the second filter inductance $LF_2$, the second filter capacitance $CF_2$, the third filter capacitance $CF_3$ and the third filter inductance $LF_3$ in a series connection.

Thus, in an embodiment according to FIG. 5 or FIG. 7, six different oscillating circuits 8', 8" are available (while, for example, in the case of the circuit shown in FIG. 6 described below, three different oscillating circuits 8" are available). In the simple case shown in FIG. 5 (oscillating circuit 8'), the exact parameters of all filter capacitances CF and filter inductances LF can also be determined exactly using an evaluation of the three oscillating circuits 8' formed via the conductor $L_4$ provided for the feedback (i.e. the fourth conductor output $W_4$). For the circuit in FIG. 6, for example, no parameters related to individual filter capacitances can be determined by the methods disclosed here, but the effective filter inductance $L_m$ and effective filter capacitance $C_m$ can be determined, which is sufficient for the control 16 of the inverter 1. The variant of the method that is preferred in each case thus depends on the specific topology of the switching arrangement 2 or the filter circuit 3 connected thereto.

If further filter capacitances CF are present in the filter circuit 3 (as is Indicated, for example, in FIG. 5 by the filter capacitances $CF_4$ to $CF_6$ drawn in dashed lines), the sum value of parallel filter capacitances in the oscillating circuit can again be determined as the effective filter capacitance $C_m$.

FIG. 6 shows a three-phase inverter 1 which, however, has a filter circuit 3 that does not have a feedback to the switching arrangement 2. Three conductor outputs $W_1$-$W_3$ are each connected to a conductor $P_1$-$P_3$, wherein the conductors can each be connected to a phase $L_1$-$L_3$ of the power grid 7.

The filter circuit 3 comprises (in the direction from the conductor outputs W to the grid relays 4) three filter inductances $LF$-$LF_3$ (one per conductor), a star connection with three filter capacitances $CF_1$-$CF_3$ and a free star point, three EMC chokes $L_{EMV1}$-$L_{EMV3}$ (one per conductor) and three filter capacitances $CF_4$-$CF_6$ in delta connection. When the grid relay 4 is closed, the free star point could also be connected to a neutral conductor N of the power grid 7.

Any combination of star and/or delta connections of capacitors can be represented as an equivalent circuit in the form of a pure star connection or in the form of a pure delta connection. In this sense, for the star-delta connection in FIG. 6, the delta connection made up of $CF_4$, $CF_5$, $CF_6$ can be replaced by an equivalent star connection, for example. This results in two star connections with the star connection of $CF_1$, $CF_2$, $CF_3$, which in turn can be combined into a single equivalent star connection. This results in an equivalent circuit 15 for FIG. 6 with the effective filter capacitances $C_{m1}$, $C_{m2}$, $C_{m3}$ as equivalent total capacitances according to FIG. 8.

For the determination of the system parameters SP in FIG. 6, one of the three conductor outputs $W_1$-$W_3$ is again first subjected to a voltage pulse. Immediately after the voltage pulse, starting from this conductor output, an oscillating circuit 8" is built up via the filter circuit 3, wherein this conductor output is short-circuited via the switching arrangement 2 with one of the two remaining conductor outputs $W_1$-$W_3$. As before, the corresponding oscillating circuit 8" runs as the voltage pulse before in parallel over the star connection and the delta connection of the filter circuit 3, wherein the EMC chokes $L_{EMV}$ are again disregarded. The effective filter capacitances $C_{m1}$, $C_{m2}$, $C_{m3}$ of the equivalent circuit 15 in FIG. 6 are obtained by calculation with the determination of the equivalent total capacitances in FIG. 8.

If for FIG. 6 a star connection is used as an equivalent circuit 15, as in FIG. 8, three total capacitances $C_{m12}$, $C_{m23}$, $C_{m31}$ can be determined using the method described above. In the case of a star equivalent circuit, these correspond to the total capacitances of the series connection of two equivalent total capacitances ($C_{m1}$, $C_{m2}$, $C_{m3}$). The following system of equations can be set up with the determined total capacitances $C_{m12}$, $C_{m23}$, $C_{m31}$:

$$C_{m12} = \frac{C_{m1} * C_{m2}}{C_{m1} + C_{m2}}$$

$$C_{m23} = \frac{C_{m2} * C_{m3}}{C_{m2} + C_{m4}}$$

$$C_{m31} = \frac{C_{m1} * C_{m3}}{C_{m1} + C_{m3}}$$

The effective filter capacitances $C_{m1}$, $C_{m2}$, $C_{m3}$ of the individual phases can be determined from this system of equations by solving the above equation system for the effective filter capacitances $C_{m1}$, $C_{m2}$, $C_{m3}$, which leads to the following equations:

$$C_{m1} = \frac{2 * C_{m12} * C_{m23} * C_{m31}}{C_{m12} * C_{m23} - C_{m12} * C_{m31} + C_{m23} * C_{m31}}$$

$$C_{m2} = \frac{2 * C_{m12} * C_{m23} * C_{m31}}{C_{m12} * C_{m23} - C_{m12} * C_{m31} - C_{m23} * C_{m31}}$$

$$C_{m3} = \frac{2 * C_{m12} * C_{m23} * C_{m31}}{C_{m12} * C_{m23} + C_{m12} * C_{m31} - C_{m23} * C_{m31}}$$

For illustration, FIG. 9 shows a voltage pulse 10 in a first diagram, and the response of the oscillating circuit 8" to the voltage pulse 10, for example according to FIG. 8, is shown in two further diagrams. In the example shown, the oscillating circuit 8" consists of the effective filter capacitances $C_{m2}$, $C_{m3}$ and the filter inductances $LF_2$, $LF_3$ (which in this example correspond to the effective filter inductances $L_m$). Among other things, a resonant frequency ($f_{reso}$=1593.8 Hz), a current amplitude (I=32.9 A) and a voltage amplitude (U=32.9 V) can be determined via the determined current curve 11 or the voltage curve 12. Inserted into Eq. 4, this results in a value of $C_{m23}$=100 µF for the effective total capacitance $C_{m23}$. With this procedure $C_{m12}$ and $C_{m31}$ can be determined in the same way. The effective filter capacitances $C_{m1}$, $C_{m2}$, $C_{m3}$ can thus be determined using the above system of equations.

The effective filter capacitances $C_{m1}$, $C_{m2}$, $C_{m3}$ correspond to the current values required for the control and can in turn be transformed into effective filter capacitances for a delta equivalent circuit of capacitors by means of star-delta transformation if required, if a control 16 requires the effective filter capacitances $C_{m1}$, $C_{m2}$, $C_{m3}$ in this form.

According to FIG. 8, three total inductances $L_{m12}$, $L_{m23}$, $L_{m31}$ can also be determined using the method described above. With these, the following system of equations can be set up:

$$L_{m12}=LF_1+LF_2$$

$$L_{m23}=LF_3+LF_2$$

$$L_{m23}=LF_1+LF_3$$

Analogously to the determination of the total capacitance $C_{m23}$, the total inductance $L_{m23}$ can be calculated using Eq. 3 and the values determined according to FIG. 9 with $L_{m23}$=100 µH. The total inductances $L_{m12}$ and $L_{m31}$ can be determined in the same way with the method. This means that the system of equations above can be solved for the effective filter inductances $L_{m1}=LF_1$, $L_{m2}=LF_2$ and $L_{m3}=LF_3$ and the current values can be calculated:

$$L_{m1} = \frac{1}{2}(L_{m12} - L_{m23} + L_{m31})$$

$$L_{m2} = \frac{1}{2}(L_{m12} + L_{m23} - L_{m31})$$

$$L_{m3} = \frac{1}{2}(-L_{m12} + L_{m23} + L_{m31})$$

The exemplary voltage pulse 10 in FIG. 9 is generated by the switching arrangement 2 of an inverter 1 at the time t=1 ms with u1=600V. In the preceding idle state (e.g. before normal operation), the filter capacitor(s) affected by the voltage pulse 10 are discharged in this example (u2=0 V) and no current flows through the affected filter inductance(s) (i=0 A). The current curve 11 shows the current flow through the effective filter inductance $L_m$. At maximum current, the voltage measured across the effective filter capacitance $C_m$ is minimal or zero according to the voltage curve 12 and the entire energy of the oscillating circuit 8 is stored in the magnetic field of the effective filter inductance $L_m$. The oscillating circuit 8 is formed immediately after the pulse. Shortly before t=1.2 ms, the current flow 11 through the effective filter inductance $L_m$ is minimal or zero and the entire energy of the oscillating circuit 8 is stored in the effective filter capacitance $C_m$, wherein the voltage curve 12 has the maximum voltage. Eq. 1 is based on this relationship.

The current values for the effective filter capacitance $C_m$ and the current values for the effective filter inductance $L_m$ can therefore be determined based on the systems of equations.

In the case of inverters 1 with three or more phase conductors $P_1$, $P_2$, $P_3$ and without a defined zero state, such as a topology as in FIG. 6, however, there can be certain difficulties in the determination of the effective filter capacitances $C_m$ and the effective filter inductances $L_m$ of the individual phases. In the test case shown in FIG. 6, the oscillating voltage is divided at the filter capacitances $CF_2$, $CF_3$. In the ideal case, both filter capacitances $CF_2$, $CF_3$ are the same size, as a result of which the potential which was applied by the switching arrangement 2 for the voltage pulse (e.g. DC+ or DC−) is established at the common capacitor star point.

However, if the two filter capacitances $CF_2$, $CF_3$ are not the same size, which is quite possible in reality, this no longer applies. In this case, the potential of the capacitor star point oscillates. This oscillation of the potential of the capacitor star point also causes the potential at the conductor output $W_1$ to oscillate via the filter inductance $LF_1$ because $W_1$ is to be regarded as open for this test case. This undesired oscillation of the conductor output $W_1$ can lead to the potential of the positive intermediate circuit voltage DC+ being exceeded or the potential of the negative intermediate circuit voltage DC− being undershot. In both cases, one of the freewheeling diodes D of the semiconductor switches T in the switching branch of the conductor output $W_1$ would become conductive, as a result of which a current would flow into the intermediate circuit and would falsify the measurement of current and voltage, resulting in an inaccurate determination of the effective filter capacitances $C_m$ and the effective filter inductances $L_m$. This effect is called "clamping". This clamping effect is independent of whether the filter capacitors $CF_1$, $CF_2$, $CF_3$ are arranged in a star or delta connection and can also occur with filter inductances $LF_1$, $LF_2$, $LF_3$ of different sizes. It is obvious that this clamping can also occur in the case of oscillating circuits 8" that are formed other than those shown in the test case in FIG. 6. By measuring the current through the filter inductances LF (which will be implemented in any case for the method according to the invention), such clamping can be detected and, if necessary, taken into account for the control.

In order to prevent such clamping, a topology with a conductor $P_4$ used as feedback from the filter circuit 3 to the switching arrangement 2, which is connected to a defined zero state, can be used. Such a topology would be, for example, a topology as shown in FIG. 7, where the conductor $P_4$ is connected to the intermediate circuit center point MP, or as in FIG. 5, if the conductor $P_4$ is also connected to an intermediate circuit center point MP. This can prevent an oscillating potential at the capacitor star point.

Another possibility for preventing clamping would be not to leave the potential of the phase unused for the respective test case (the phase $P_1$ in the test case of FIG. 6) free-floating, but to connect via the switching arrangement to the potential which was used for the voltage pulse (i.e. DC+ or DC−), which prevents the potential from oscillating at the associated conductor output W. However, due to resulting circuit, the filter inductance $LF_1$ and filter capacitances $CF_1$ of the phase P, unused for the test case are involved in the oscillating circuit 8" of the test case and must therefore be taken into account when determining the effective filter capacitances $C_m$ and effective filter inductances $L_m$. This would make the equations explained above somewhat more complex, but would not change the basic procedure for determining the effective filter capacitances $C_m$ and effective filter inductances $L_m$.

The decay behavior of the oscillating circuit is not shown in FIG. 9, but the parameters for it can also be determined on the basis of this and can also be taken into account in the control. Due to the decay behavior, it is important for the accuracy of the determined system parameters SP to determine the voltage and current amplitude U, I of the voltage and current curve 11, 12 as closely as possible in time, so that an energy balance according to Eq. 1 can be assumed. The period of time depends on the resonant frequency and the decay behavior and is, for example, one or a few period duration(s) of the resonant frequency. The method illustrated in FIG. 9 can also be applied to all the other topologies previously disclosed and also to other topologies.

For the purpose of the control 16 of the energy conversion or the switching arrangement 2 of the inverter 1, system parameters SP in the form of effective filter capacitances $C_m$ and/or effective filter inductances $L_m$ of a filter circuit 3 are sufficient. It is not necessary to determine individual component values, but this can result in certain cases. A permitted value range can also be defined for values of effective filter capacitances $C_m$, wherein error messages or error states of an inverter 1 can be defined for values outside the permitted value range.

The invention claimed is:

1. A method for controlling a switching arrangement of an inverter with a control, wherein the inverter has the switching arrangement, a filter circuit and a grid relay and the control takes system parameters of the filter circuit of the inverter into account, wherein the switching arrangement has at least two conductor outputs and each of the at least two conductor outputs is connected to the filter circuit by a conductor, and the conductors of the inverter provided for connection to a power grid are connected to the grid relay, wherein the filter circuit is formed from at least one filter inductance arranged in the conductors and at least one filter capacitance which connects the at least two conductors to one another, and for the filter circuit use is made of an equivalent circuit consisting of an effective filter inductance ($L_m$), which results from the at least one filter inductance of the filter circuit and a topology of the filter circuit, and an effective filter capacitance ($C_m$), which results from the at least one filter capacitance of the filter circuit and the topology of the filter circuit, wherein the effective filter inductance ($L_m$) and the effective filter capacitance ($C_m$) are used as system parameters, and the method comprises the following, which are carried out with the grid relay open:

applying a voltage pulse between a first conductor output and a second conductor output, connecting this first conductor output and this second conductor output via the switching arrangement to produce a closed oscillating circuit which runs, starting from the first conductor output and the first conductor connected to the first conductor output via the filter circuit and the second conductor to the second conductor output connected to the second conductor, determining a current curve and/or voltage curve in the closed oscillating circuit, evaluating the current curve and/or voltage curve to determine at least one current value of the effective filter inductance ($L_m$) and the effective filter capacitance ($C_m$) of the filter circuit as system parameters of the filter circuit, and the switching arrangement of the inverter is controlled with closed grid relay taking into account the determined current values of the effective filter inductance ($L_m$) and the effective filter capacitance ($C_m$) of the filter circuit.

2. The method according to claim 1, wherein the applying the voltage pulse, producing the closed oscillating circuit and determining and evaluating the current and/or voltage curve are repeated on a plurality of different pairs of conductors.

3. The method according to claim 1, wherein in the inverter with a fourth conductor provided for a feedback from the filter arrangement to the switching arrangement, one of the other conductors of the inverter is used as the first conductor, and the fourth conductor provided for the feedback from the filter arrangement to the switching arrangement is used as the second conductor.

4. The method according to claim 1, wherein in the case of the inverter without a fourth conductor provided for a feedback from the filter arrangement to the switching arrangement, one of the available conductors of the inverter is used as the first conductor, and another of the available conductors of the inverter is used as the second conductor.

5. The method according to claim 4, wherein the conductors of the inverter that is are not used for determining the effective filter inductance and filter capacitance is connected to an intermediate circuit potential via the switching arrangement.

6. The method according to claim 1, wherein a resonant frequency ($f_{reso}$) of the closed oscillating circuit is determined from the current curve and voltage curve, wherein according to the formula $$L_m = \frac{1}{2 \cdot \pi \cdot f_{reso}} \cdot \frac{U}{I}$$

a value of the effective filter inductance ($L_m$) is determined.

7. The method according to claim 1, wherein a resonant frequency ($f_{reso}$) of the closed oscillating circuit is determined from the current and voltage curve, wherein according to the formula $$C_m = \frac{1}{2 \cdot \pi \cdot f_{reso}} \cdot \frac{I}{U}$$

a value of the effective filter capacitance ($C_m$) is determined.

8. The method according to claim 1, wherein a decay behavior of the current curve and/or voltage curve in the closed oscillating circuit is determined and the decay behavior is taken into account in the control.

9. The method according to claim 1, wherein the closed oscillating circuit is produced immediately after the voltage pulse.

10. An inverter comprising:
a switching arrangement with semiconductor switches and a system control, in which a control with a controller with controller parameters for controlling the switching of the semiconductor switches is implemented,
a filter circuit and a grid relay and the control is configured to take system parameters of the filter circuit of the inverter into account,
the switching arrangement includes at least two conductor outputs and each of the at least two conductor outputs is connected to the filter circuit via conductors, and the conductors of the inverter provided for connection to a power grid are connected to the grid relay, wherein at least one filter inductance arranged in the conductors and at least one filter capacitance which connects the at least two conductors to one another are provided in the filter circuit, wherein an effective filter inductance, which results from the at least one filter inductance of the filter circuit and a topology of the filter circuit, and an effective filter capacitance, which results from the at least one filter capacitance of the filter circuit and the topology of the filter circuit, of an equivalent circuit of the filter circuit are provided as system parameter, wherein the switching arrangement is configured to apply a voltage pulse between a first conductor output and a second conductor output when the grid relay is open, wherein the switching arrangement is configured to connect this first conductor output and this second conductor output after the application of the voltage pulse to produce a closed oscillating circuit which runs, starting from the first conductor output and the first conductor connected thereto via the filter circuit and the second conductor to the second conductor output connected thereto, the system control is configured to determine a current value of the effective filter inductance and the effective filter capacitance of the filter circuit from an electrical current determined in the closed oscillating circuit and/or from an electrical voltage determined in the closed oscillating circuit, and wherein the system control is configured to control the inverter with closed grid relay with the determined current values of the effective filter inductance and the effective filter capacitance of the filter circuit.

* * * * *